United States Patent [19]

Speidel et al.

[11] 4,354,155

[45] Oct. 12, 1982

[54] CIRCUIT ARRANGEMENT FOR MONITORING A CURRENT-CONSUMING LOAD

[75] Inventors: Volker Speidel, Schalksmühle; Eduard Bergmann, Ludenscheid; Klaus Kassner, Bochum; Werner-Ernst Berginski, Werdohl-Eveking, all of Fed. Rep. of Germany

[73] Assignee: Firma Leopold Kostal, Fed. Rep. of Germany

[21] Appl. No.: 79,600

[22] Filed: Sep. 27, 1979

[30] Foreign Application Priority Data

Sep. 29, 1978 [DE] Fed. Rep. of Germany ....... 2842470
Feb. 19, 1979 [DE] Fed. Rep. of Germany ....... 2906263

[51] Int. Cl.³ .................... G01R 31/02; G01R 19/15
[52] U.S. Cl. .................................. 324/133; 324/51; 324/127; 340/643
[58] Field of Search .............. 324/51, 123, 127, 133, 324/126; 340/664, 659, 641–643

[56] References Cited

U.S. PATENT DOCUMENTS

| | | | |
|---|---|---|---|
| 3,364,470 | 1/1968 | Thompson | 340/664 X |
| 3,769,577 | 10/1973 | Schnur et al. | 324/133 X |
| 3,815,013 | 6/1974 | Milkovic | 324/127 X |
| 3,863,150 | 1/1975 | Cebuliak et al. | 324/133 |
| 3,916,310 | 10/1975 | Stark et al. | 324/127 |
| 4,011,507 | 3/1977 | Rossell | 324/133 X |
| 4,240,072 | 12/1980 | Fowler | 340/664 |

OTHER PUBLICATIONS

Carter et al, Voltage Source Direction Detector With Digital Ouput, IBM Tech. Discl. Bull. vol. 18, No. 7, Dec. 1975, pp. 2116, 2117.
Wright, M. J. A bidirectional pulse stretcher has many uses, Electronic Design vol. 24, No. 22, pp. 180–183, Oct. 25, 1976.

*Primary Examiner*—Gerard R. Strecker
*Attorney, Agent, or Firm*—Jacobs & Jacobs

[57] ABSTRACT

Circuit arrangement for monitoring an electricity-consuming load fed with direct current one terminal of which is grounded, particularly for monitoring an incandescent of an automotive vehicle, and the circuit arrangement being installable without interfering with the existing network of lines or cutting conductors. Between the switch of the load and the current-consuming device a measurement coil is arranged parallel to a conductor within the magnetic field produced by the flow of electricity through the conductor, the input of the coil being connected to a voltage supply source and its output being connected in a Schmitt trigger circuit with the non-inverting input of a differential amplifier constituted as operational amplifier and the output of the amplifier being fed back via a resistor to the non-inverting input and being connected to a fault indicator.

12 Claims, 5 Drawing Figures

CIRCUIT ARRANGEMENT FOR MONITORING A CURRENT-CONSUMING LOAD

This invention relates to a circuit arrangement for monitoring an electricity-consuming load fed with direct current one terminal of which is grounded, particularly for monitoring an incandescent bulb of an automotive vehicle.

BACKGROUND OF THE INVENTION

Various prior art solutions have been proposed to meet the foregoing objectives.

All of the prior art arrangements involve circuits by means of which the failure of an electric load-consuming device, for instance a bulb, a heating pane and the like on an automobile can be noted.

For this purpose there is employed the basic concept that the magnetic field which builds up around a conductor traversed by current is used for the measurement.

It is already known to use for this purpose reed contacts which, however, make it necessary to develop the current-conducting line as a coil with a large number of turns, which makes it necessary to alter the electrical system of the car.

The present invention is therefore based on the goal of creating a circuit arrangement of the above-designated type which can be installed without interfering with the existing network of lines or cutting conductors, and therefore at very low expense.

SUMMARY OF THE INVENTION

In order to achieve this purpose, the invention proposes that between a switch and a current-consuming device or load a measurement coil be arranged parallel to a conductor within the magnetic field produced by the flow of electricity through the conductor, the input of said coil being connected to a voltage supply source and its output being connected in a Schmitt trigger circuit having non-inverting input of a difference amplifier developed as operational amplifier, the inverting input being grounded via a capacitor and the coil furthermore together with the capacitance of the circuit representing an oscillatory circuit which is damped by a measurement resistor connected in parallel to the measurement coil; that furthermore the inverting input is connected via a series resistor to a voltage divider formed of individual resistors fed with said voltage, one of said individual resistors being grounded, and furthermore the output of the operational amplifier being fed back via a resistor to the non-inverting input and being connected with a fault indicator.

The measurement coil with electronic system behind it can be arranged at any desired place in the current-conducting line of the current-consuming device, by being, for instance, clipped onto same.

It is not necessary to cut any wires.

A voltage is induced in the measurement coil whenever there is a change in the current through the consuming device and thus a change in the magnetic field around the conductor.

This varying field is present at the time of connection and disconnection and also if the current consuming device fails during operation.

At all other times, the differential change in the field with respect to time is zero.

Since the direction of the voltage induced in the measurement coil depends on the direction of the change in field and therefore on the direction of the change in current, a clear determination can be made as to whether the current-consuming device has been connected or disconnected.

The coil forms an oscillatory circuit together with the capacitance of the circuit arrangement.

The measurement resistor which is connected in parallel to the coil dampens the oscillatory circuit to such an extent that the aperiodic limit case is present.

Thus only a negative voltage is obtained as connecting pulse and only a positive voltage as disconnecting pulse.

For the evaluation and storing of the pulses received there is employed a positive-coupled operational amplifier in a Schmitt trigger circuit.

The reference potential of the inverting input is so selected that it lies between the trigger levels in the middle of the hysteresis.

The result is thereby obtained that the voltage pulses connect and disconnect the Schmitt trigger and the last pulse is stored.

It is arranged that the voltage at the output is to correspond at positive potential to the state of "defect of current consuming device."

In order to recognize whether the current consuming device is connected, the supply voltage for the sensor is tapped off behind the switch, for instance by means of an additional supply line.

The capacitor at the inverting input insures that the output has a well-defined positive potential upon the connection of the supply voltage.

Since, when the consuming device is operable, the connecting pulse is taken up by the coil, the Schmitt trigger immediately flips back after the connection so that the information "consuming device o.k." appears at the output.

The peak value of the voltage given off by the coil is obtained, depending on the capacitance of the circuit and the inductance of the coil, a few microseconds after the connecting. The output of the operational amplifier, to be sure, is of high potential for a very short time, which, however, is not visually observed.

A defect which occurs during the operation of the current-consuming device results in a positive pulse which connects the Schmitt trigger again to high potential. A loose contact is also detected, since the logical state of the output always follows the change with time of the current through the current consuming device and its direction.

Upon the disconnecting of the current-consuming device the supply voltage of the sensor is also disconnected, so that the defect indication which appears as the result of a defect is extinguished.

In order to exclude interference it is necessary to protect the measurement coil from magnetic fields of adjacent lines.

For this purpose, the housing which receives the circuit arrangement can be so constructed that a minimum distance is assured between coil and adjacent lines.

Preferably at least the measurement coil is magnetically shielded.

In order to facilitate the supplying of the voltage and not to require an additional supply line it is proposed that, in the region of the clipping in place, at one point the insulation of the consuming-device line be penetrated by a voltage detector with knife contact.

The circuit arrangement in accordance with the invention does not respond to false signals, to voltage variations or to the on/off switch pulses.

One essential advantage of the invention resides in the fact that the circuit arrangement can be arranged—even subsequently—at any desired place on a line of the current-consuming device in the network of a vehicle without cutting lines.

It has been found that the voltage induced in the measurement coil is frequently not sufficient to give a sufficiently strong signal to the following electronic system, particularly if, due to small current consumption of the consuming device, a change in the current as a result of the failure of a current consuming device, and thus also the change in the magnetic field around the conductor, are also only slight.

Another object of the invention is to create from a few easily assembled parts a device which can be installed subsequently in the system of lines of a vehicle even by a layman and which can include one, or even more, load-consuming lines which are to be monitored which increase the voltages induced in measurement coils.

This is achieved, in accordance with the invention, in the manner that the measurement coil receives as core a yoke plate which is displaceable through the coil body and is provided with a slot on both of the sides thereof parallel to the coil winding, into which plate there can be inserted a yoke which lies parallel to the measurement coil, surrounds the conductor, and has corresponding feet, all functional parts being surrounded by a housing.

By means of the yoke which surrounds the conductor and is parallel to it, the field lines produced by conductors traversed by current are trapped and collected, whereby the voltage induced in the measurement coil is increased. Due to the possibility of inserting the yoke into the yoke plate, it is possible, upon the installation of the device in the network of lines of a vehicle, to first remove the yoke, insert the line without cutting it and place the yoke on again.

Illustrative examples are indicated in the drawings. Thus the length of the yoke over the conductor is determinative for the number of field lines intercepted. With a length which is at least equal to the coil winding, sufficient increase in induction for practical purposes is already obtained.

The walls which are arranged on both sides of the coil body are designed and arranged to fulfill several purposes. First of all they form the winding space. The supporting of the coil-side edges on the intermediate wall of the housing imparts sufficient support for the coil body and stabilizes the entire structure, in combination with the plastic housing. By means of the locking feet developed on the lower wall edges the coil body is fastened in the circuit board. Around the two pins attached on a wall the stripped ends of the coil are wound. The pins, after the mounting of the coil body, extend through corresponding holes in the circuit board, whereby its position of installation is determined and thus the confusing of polarity in the sense of the direction of winding of the coil, is excluded in the case of series manufacture.

By the angular position of the slots which receive the locking feet with respect to the straight line formed by the two pin-receiving holes one obtains, upon the mounting of the coil body on the circuit board, an attachment which prevents the coil body being placed-on improperly due to a confusing of the polarities.

By the point of the contact pin the insulation of the conductor is perforated and thus the voltage potential of the conductor is led to a conductive path of the circuit board. Each consuming-device circuit to be monitored requires a separate contact pin.

Due to the fact that, by claw-like formulation, the flat plugs, the fastening ends of which lie on the uncoated side of the circuit board, are soldered by their claw ends, i.e. on the opposite side of the circuit board which contains the conductive paths, protection is obtained against the tearing apart of lifting off of conductive paths from their base, as can occur when the plug pins are subjected to bending stresses, for example upon the inserting or removal of the flat plug sleeves.

With the one-piece magnetic shielding of the housing from external field and by connecting the cover part and the bottom part to the housing there will be obtained a simplification both in connection with the manufacture of the part and in the mounting of the device and its installation on the vehicle.

The development of the ribs on the intermediate plate in accordance with the arrangement hereinafter described makes it possible, on the one hand, to insert lines of different cross section in grooves and, on the other hand, to support the ribs on the coil body which, due to the pressure of the yokes on the lines which is transmitted by the latter to the ribs, is of importance since otherwise the coil windings could be damaged.

By means of the cutouts adapted to the yoke end surfaces there is obtained a good guidance of the yokes. The initial pressing of the cover against the inside which is already established by a corresponding development of the mold assures an intimate contact of the yokes with the lines, as a result of which the field lines are completely trapped and at the same time a vibration-free seat of the individual parts is assured.

BRIEF DESCRIPTION OF DRAWING FIGURES

A circuit arrangement is shown by way of example in the drawing and will be briefly explained below.

Furthermore, illustrative embodiments will be described in detail with reference to the drawings in which.

DETAILED DESCRIPTION OF PREFERRED EMBODIMENT

Figure 1:
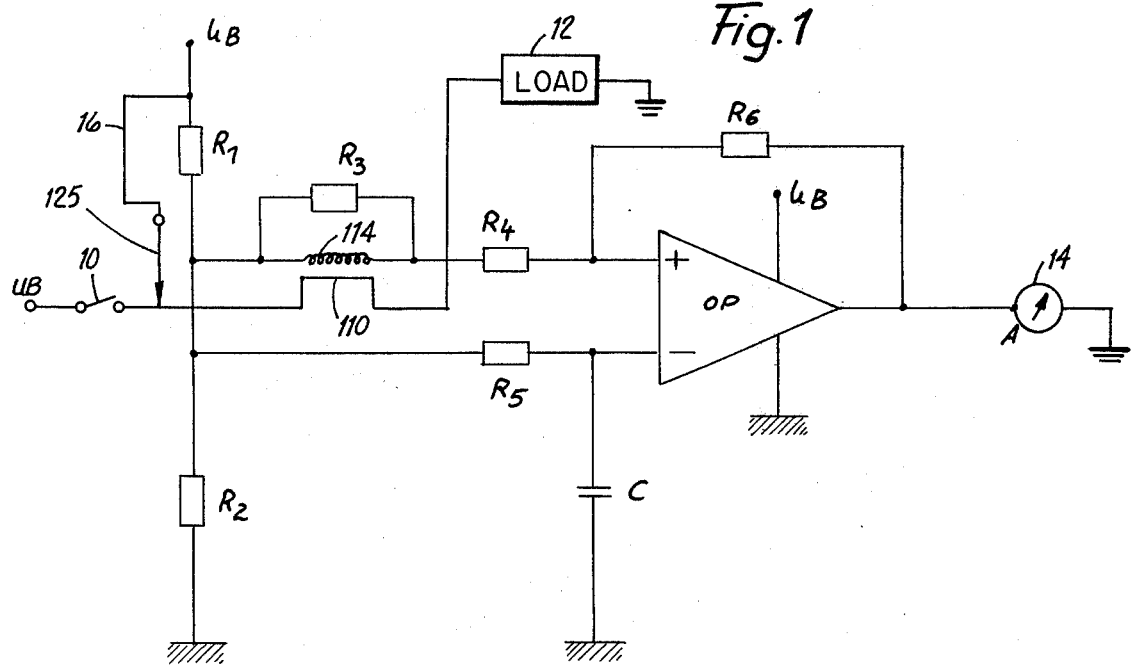
FIG. 1 shows a circuit arrangement.

As shown in FIG. 1, between a switch 10 and a current-consuming device or load 12, a measurement coil 114 is arranged parallel to a conductor 110 within the magnetic field produced by the flow of electricity through the conductor.

The measurement coil 114 with its resistor $R_3$ connected in parallel is fed by the supply voltage $U_B$ and connected via a series resistor $R_4$ with the non-inverting input of a difference amplifier developed as operational amplifier OP in a Schmitt trigger circuit, which is also connected to the supply voltage $U_B$ and to ground.

The output of the operational amplifier OP is fed back via a resistor R₆ to the non-inverting input.

The inverting input is connected via a capacitor C to ground and via a series resistor R₅ to a voltage divider, formed of the individual resistors R₁, R₂ which is fed by the supply voltage $U_B$, R₂ being connected to ground.

Figure 2:
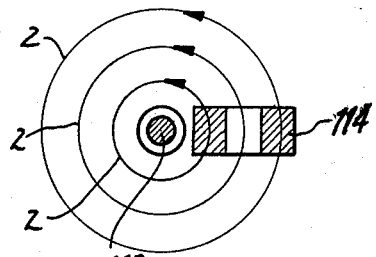
FIG. 2 shows a detail in cross section.

FIG. 2 shows by itself the consuming-device line 110 around which a magnetic field 2 is developed upon the flow of current.

Within the magnetic field 2 there is arranged the coil 114 which reacts to changes in the field.

The measurement coil with electronic system behind it may be arranged at any desired place in the current-conducting line of the current consuming load 12 by being clipped thereto without cutting any wires. A voltage is induced in the measurement coil 114 whenever there is a change in the current through the load 12 and thus a change in the magnetic field about the conductor. This varying magnetic field is present at the time of connection and disconnection and also when the current consuming load fails during operation. At all other times, the differential change in the field with respect to time is zero. Since the direction of the voltage induced in the measurement coil depends on the direction of the change in the field and therefore, on the direction of the change in current, a definite determination may be made as to whether the current-consuming device has been connected or disconnected.

The coil 114 forms an oscillatory circuit with the capacitance C of the circuit arrangement. The measurement resistor R₃ which is connected in parallel with the coil dampens the oscillations produced to such an extent that an aperiodic characteristic is established as is well known in the art. Thus, only a negative voltage is obtained as a connecting pulse and only a positive voltage as a disconnecting pulse. The evaluation and storing of such pulses is achieved by use of the positive-coupled operational amplifier OP in the Schmitt trigger circuit.

The reference potential at the inverting input to the amplifier is so selected that it lies between the trigger levels in the middle of the hysteresis curve associated with the amplifier voltage characteristic. As a result of the foregoing arrangement, the voltage pulses connect and disconnect the Schmitt trigger and the last pulse is stored. The voltage at the output of the amplifier OP is arranged to correspond to a defective condition of the current consuming device represented by a positive potential. In order to recognize whether the current consuming device is connected, the supply voltage is tapped off behind the switch 10 by means of an additional supply line 16. The capacity C at the inverting input insures that the output has a well defined positive potential in response to connection of the supply voltage. When the power consuming device 12 is operating, the connecting pulse is absorbed by the measuring coil 114 causing the Schmitt trigger to immediately flip back after the circuit connection is established so that the output reflecting an operating consuming device appears on the indicator 14 connected to the amplifier. The peak value of the voltage across the coil 114 which depends on the capacitance of the circuit and the inductance of the coil, occurs a few microseconds after the connection is established. The peak output of the operational amplifier OP is of such short duration that it is not visually observed on the indicator 14. A defect which occurs during operation of the current consuming device 12 produces a positive pulse which connects the Schmitt trigger once again to a high potential shown on the indicator 14. A loose contact in the load circuit is also detected since the logical state of the output always follows the directional change in current as a function of time through the current consuming device. When the current consuming device is disconnected, the voltage supply source is also disconnected so that any defect indication which would otherwise appear on the indicator 14 is extinguished.

Figure 3:
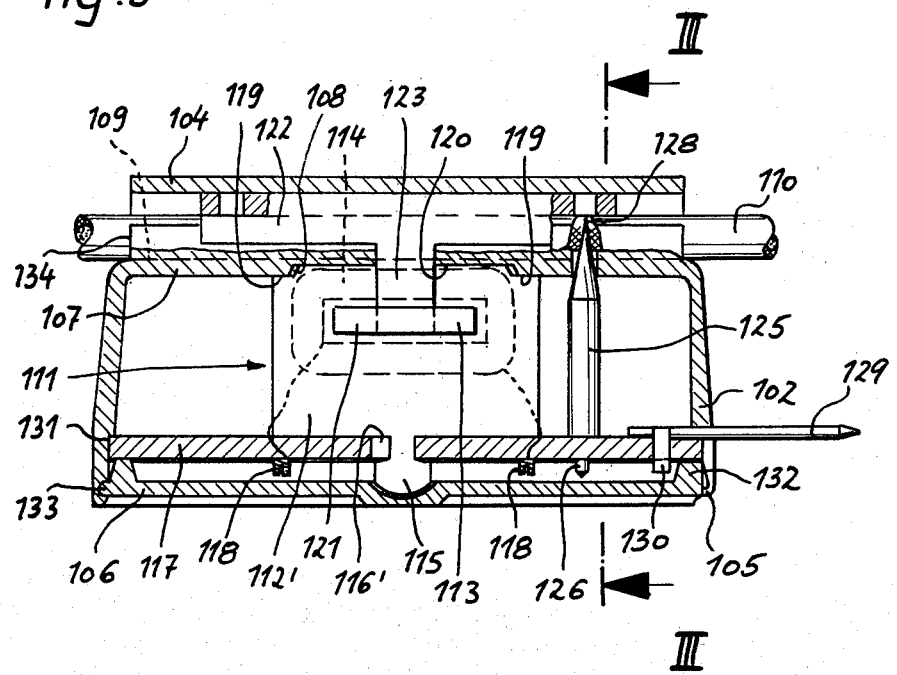
FIG. 3 is a longitudinal section through the circuit arrangement with lines inserted in accordance with the invention.
Figure 4:
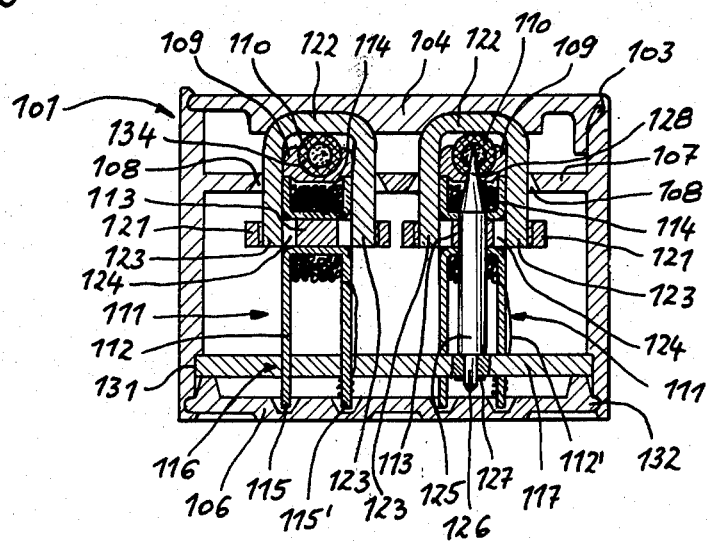
FIG. 4 is a section through the circuit arrangement along the section line III—III.

The housing 101 shown in FIGS. 3 and 4 consists of the housing shell 102 having a cover 104 connected to it on the one side via film hinge 103 and the bottom part 106 formed on the other side, also by means of film hinge 105. The hinges 103 and 105 are relatively thin sections of the material from which the housing shell is formed by injection molding as is well known in the art. An intermediate plate 107 molded thereon has, in its surface, windows 108 over which there lies ribs 109 with grooves 134 for the insertion of consuming-device lines 110. Coil bodies 111 each have two side walls 112, 112′ between which the windings 114 are guided in the region of the coil hollow cores 113.

Figure 5:
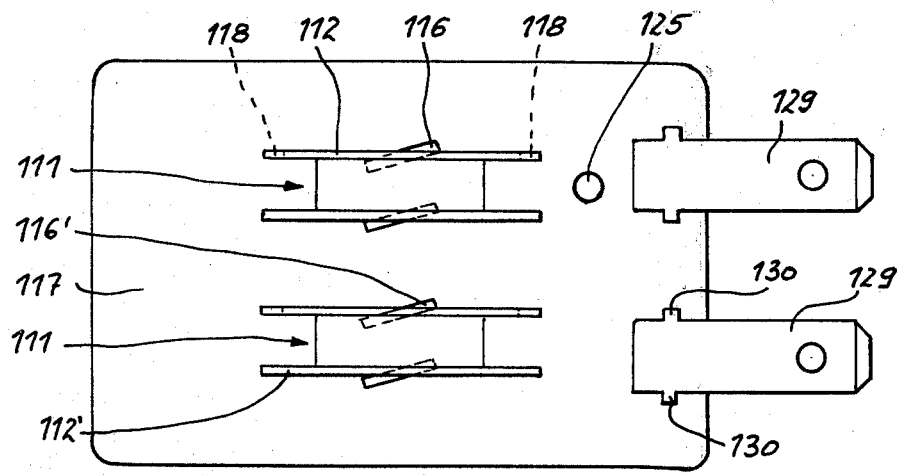
FIG. 5 is a top view of the circuit board with coil bodies, contact pin, and flat plugs.

As shown in FIGS. 3 and 5 the lower edges of the side walls 112, 112′ are provided locking feet 115, 115′ which extend through slots 116, 116′ in a circuit board 117 on which the circuit components are mounted as described with respect to FIG. 1. On one side wall 112′ there are present, in addition to the one locking foot 115′, also two pins 118 around which the stripped ends of the coil winding 114 are wound. For these pins 118 there are provided, in the circuit board 117, receiving holes on a straight line with which the slots 116, 116′ form an angle. For installing of a coil body 111 in the circuit board, the locking feet 115, 115′ are first of all inserted into the slots 116, 116′ and then turned so that the pins 118 come to lie in the holes of the circuit board. The coil-side edges of the side walls 112, 112′ of the coil body 111 rest, by means of the stepped outer ends 119, against the intermediate plate 107, while the protruding central pieces 120 brace the ribs 109 so that the latter do not press against the windings 114. Yoke plates 121 are pushed into the hollow cores 113 of the coil bodies 111. The feet 123 of the yokes 122 extend on both sides of the coil body into slots 124 of the yoke plates. The base plug 126 of a contact pin 125 passes through the circuit board 117 and is soldered at its end to a conductive path 127. The point 128 of the contact pin 125, after the inserting of the consuming-device line 110 and the placing on of the yoke 122, penetrates through the insulation of the line 110. Flat plugs 129 are fastened by claws 130 to the circuit board 117 and soldered to conductive paths to establish electrical connections external to the circuit itself as described with respect to FIG. 1.

After the insertion of the completely fitted circuit board into the housing, the latter resting on the surrounding shoulder 131 in the housing wall 102, the bottom part 106 is swung into the inside of the housing by means of the film hinge 105. A peripheral collar 132 surrounding the bottom part 106 rests against the housing wall 102. A clip strip 133 which is developed on the edge of the bottom part 106 opposite the film attachment 105 as well as on the two side edges of the bottom part 106 engages into a groove of the housing wall 102 and forms the lock. On the side of the housing cover, the consuming-device lines 110 are placed into the groove 134 of the ribs 109, the yokes 122 are placed on, and the cover part 104 is swung closed via the film hinge 103, the cover part 104 being clipped to the housing wall 102 in the same manner as described in connection with the bottom part 106.

By means of the yoke 122 which surrounds the conductor 110 and is parallel thereto, the field flux lines 2 produced by the conductors transversed by current are trapped and collected, whereby the voltage induced in the measurement coil is increased. Because of the ability to insert the yoke 122 into the yoke plate 121, it is possible upon installation of the measuring device in an electrical network of a vehicle, to first remove the yoke, insert the conductors without cutting the wires, and then place the yoke on again. The length of the yoke along the conductor is determinative of the number of field flux lines intercepted. With a length of yoke, which is at least equal to the coil winding, a sufficient increase in induced voltage is obtained for purposes of the present invention.

The walls 112 and 112' on both sides of the coil body 111 are designed and arranged to fulfill several purposes. First, the walls form the winding space. The supporting of the coil body on the intermediate wall 107 of the housing provides sufficient support and stabilizes the entire structure including the plastic housing. By means of the locking feet 115 and 115' formed on the lower wall edges of the coil body, the coil body is fastened to the circuit board 117. The stripped ends of the winding coil are wound about the two pins 118 and 118'. After the mounting of the coil body, the pins extend through corresponding holes in the circuit board so that the position of installation is determined and polarity confusion is avoided. The locking feet receiving slots 116 and 116' in the circuit board 117 have an angular position relative to the straight line extending between the pin receiving holes so that upon mounting of the coil body on the circuit board, improper polarity mounting of the coil body on the circuit board is avoided.

The point 128 of the contact pin 125 penetrates the insulation of the conductor 110 so that the voltage potential on the conductor is applied to a conductive path of the circuit board at 127. Each consuming device circuit to be monitored requires a separate contact pin.

The flat plugs 129 are fastened by means of the claw-like formations 130 to an uncoated side of the circuit board. The claw ends are soldered to the coated side of the circuit board on which the conductive paths are established. By the foregoing arrangement, tearing apart or lifting off of conductive paths from their supporting surface is avoided even though the plugs are subjected to bending stresses when inserted or removed from plug sleeves.

By virtue of the one piece molded construction of the housing including cover 104 and bottom 106, a magnetic shield is provided against external fields, installation within a vehicle is simplified and manufacturing costs are reduced.

The formation of the ribs 109 on the intermediate plate 107 in accordance with the arrangement hereinbefore described accommodates insert of conductors of different cross sections. Support of the coil body on the ribs 109 and the pressure of the yokes 122 on the conductors transmitted by the ribs, prevents damage to the coil windings.

By means of the recesses 108 formed in the cover 104, firm guidance is provided for the yokes 122. The initial pressure exerted by the cover 104 internally of the housing is predetermined by the molding of the housing and insures intimate contact of the yokes with the conductors as a result of which, the field flux lines are completely trapped and at the same time, vibration-free seating of parts is assured.

We claim:

1. A device for monitoring DC current conducted to a grounded load from a supply voltage source through a conductor about which a magnetic field is established by said current, comprising measuring coil means physically arranged in parallel with the conductor and operatively positioned within said magnetic field for sensing changes in current conducted to the load, an operational amplifier having non-inverting and inverting input terminals, an output terminal and a feedback resistance connected between the output terminal and the non-inverting input terminal, a grounded capacitor connected to the inverting input terminal, a series resistor connecting the measuring coil means output to the non-inverting input terminal, an electrical fault indicator connected to the output terminal, and voltage divider means interconnected between the source and ground for regulating voltages applied to the measuring coil means and the inverting input terminal of the operational amplifier, said measuring coil means having its input connected to said voltage divider, and said operational amplifier having its inverting input terminal connected to said voltage divider through a resistor.

2. The combination of claim 1 including means for magnetically shielding the measuring coil means.

3. The combination of claim 1 including penetrating contact means electrically connecting the conductor directly to the source of voltage.

4. The combination of claim 1 wherein said measuring coil means includes a coil body, a coil winding supported on said body, a yoke, a yoke plate displaceably mounted on the coil body having a slot through which the yoke is inserted in surrounding relation to the conductor, and a housing enclosing the measuring coil means.

5. The combination of claim 4 wherein the yoke has a length equal at least to that of the coil winding.

6. The combination of claim 4 wherein the housing includes an intermediate plate through which the coil body extends, a circuit board received within the housing in spaced relation to the plate, a locking foot on the coil body engageable with the circuit board, and two pins on the coil body extending through pin-receiving holes formed in the circuit board to which the coil winding is connected.

7. The combination of claim 6 wherein said circuit board is provided with a slot receiving the locking foot at an angle to a straight line between the two pin-receiving holes.

8. The combination of claim 7 including at least one contact pin tapered to form a sharp point and means mounting said contact pin on the circuit board for penetrating the conductor.

9. The combination of claim 8 including a flat plug, and claw means extending from the plug through the circuit board for soldering to conductive paths thereon.

10. The combination of claim 6 wherein the housing is formed from a thermoplastic injection molded material, said housing having a shell portion, a cover and a bottom, and film hinges connecting said cover and said bottom to the shell portion.

11. The combination of claim 6 wherein the intermediate plate has at least one rib formed with a longitudinal groove within which the conductor is seated.

12. The combination of claim 10 wherein the cover is formed with a recess seating the yoke therein in engagement with the conductor.

* * * * *